United States Patent [19]

Peters

[11] Patent Number: 5,703,535
[45] Date of Patent: Dec. 30, 1997

[54] CIRCUIT ARRANGEMENT FOR AMPLITUDE-DEPENDENT ATTENUATION OF A TELEVISION SIGNAL

[75] Inventor: Matthias Peters, Neu Wulmstorf, Germany

[73] Assignee: U.S. Philips Corporation, New York, N.Y.

[21] Appl. No.: 565,772

[22] Filed: Dec. 1, 1995

[30] Foreign Application Priority Data

Dec. 16, 1994 [DE] Germany ............... 44 44 899.6

[51] Int. Cl.$^6$ ............................................. H03G 3/30
[52] U.S. Cl. ............................................. 330/278; 330/284
[58] Field of Search ........................ 330/278, 284, 330/285, 288; 348/678, 707

[56] References Cited

U.S. PATENT DOCUMENTS

| | | |
|---|---|---|
| 3,961,361 | 6/1976 | Avins et al. .................. 330/285 X |
| 4,242,643 | 12/1980 | Leidich ............................ 330/278 |
| 4,987,383 | 1/1991 | Mauthe ............................. 330/279 |

*Primary Examiner*—Steven Mottola
*Attorney, Agent, or Firm*—Edward W. Goodman

[57] ABSTRACT

A circuit arrangement for amplitude-dependent attenuation of a television signal supplies amplitude values below a predeterminable limit value as an output signal amplified by a first gain factor, and, at amplitude values above the limit value, supplies the part of the amplitude below the limit value as an output signal amplified by the first gain factor and parts of the amplitude above the limit value as an output signal amplified by a second gain factor, the second gain factor being chosen to be smaller than the first gain factor. To realize this circuit arrangement in the current range, the television signal is a current signal which is applied to a main branch (1; 13) and a sub-branch (2; 14) in which the current signal is applied to the emitter of at least one transistor (3,5; 15,18) via a resistor (4,6; 16,19), the base of each transistor (3,5; 15,18) is biased with respect to a reference potential by DC sources (7,8; 17,24), the collector current of the transistor (3; 15) in the main branch (1; 13) essentially represents the output signal, and the limit value is predeterminable by the difference between the base potentials of the two transistors (3,5; 15,18) and the second gain factor is predeterminable by means of the resistance ratio between the two resistors (4,6; 16,19).

10 Claims, 2 Drawing Sheets

CIRCUIT ARRANGEMENT FOR AMPLITUDE-DEPENDENT ATTENUATION OF A TELEVISION SIGNAL

BACKGROUND OF THE INVENTION

1. Field of the Invention

The invention relates to a circuit arrangement for amplitude-dependent attenuation of a television signal, this arrangement supplying amplitude values of the television signal below a predeterminable limit value as an output signal amplified by a first gain factor, and, at amplitude values above the limit value, supplying the part of the amplitude below the limit value as an output signal amplified by the first gain factor, and parts of the amplitude above the limit value as an output signal amplified by a second gain factor, the second gain factor being chosen to be smaller than the first gain factor.

2. Description of the Related Art

In the television technique, there is the problem that very high signal amplitudes, which occur at very bright picture details, must be attenuated by appropriate circuits so as to prevent a hazy picture or blooming of the display screen at large values of the electron beam current. There are two principal possibilities of solving this problem:

a) when a predeterminable limit value is exceeded, the signal amplitude is limited to a fixed value. However, a condition then is that no luminance distinctions are transmitted above the limit value so that contour distinctions can no longer be recognized;

b) when a predeterminable limit value is exceeded, the signal amplitude is attenuated by a predeterminable factor. As a result, luminance distinctions above the limit value are still transmitted and sharp pictures are generated. Present realizations of this possibility operate on voltages and are externally arranged outside an RGB processor.

SUMMARY OF THE INVENTION

It is an object of the invention to provide a circuit arrangement of the type described in the opening paragraph, which operates on currents and thus receives the television signal as a current.

According to the invention, this object is achieved in that the television signal is a current signal which is applied to a main branch and a sub-branch in which said signal is applied to the emitter of at least one transistor via a resistor, in that the base of each transistor is biased with respect to a reference potential by means of DC sources, in that the collector current of the transistor in the main branch essentially represents the output signal, and in that the limit value is predeterminable by means of the difference between the base potentials of the two transistors, and the second gain factor is predeterminable by means of the resistance ratio between the two resistors.

The basic function of the circuit arrangement is to derive a part of the current from the main branch to a sub-branch when the limit value is exceeded and thus to attenuate the current in the main branch. This is achieved by several base biases of the transistors in the main branch and the sub-branch. At small amplitudes, the transistor in the sub-branch is turned off and the overall current is supplied via the main branch. When this limit value is exceeded, the transistor of the sub-branch is turned on and the current is divided in accordance with the resistance ratio between the resistors in the main branch and the sub-branch.

The gain factor is the factor by which pans of the amplitude above or below the limit value are available in an amplified form in the output signal. This factor may be both smaller than 1 and larger than 1. Generally, this factor will be substantially 1 for amplitude values below the limit value and between 0 and 1 for amplitude values above the limit value.

Realization of the circuit arrangement in the current range has the advantage that it can be integrated in an RGB processor whose internal interfaces are located in the current range. Consequently, additional current-voltage converters or voltage-current converters, which would lead to unnecessary losses of power and reduce the bandwidth, can be dispensed with. Moreover, no additional current is required for the circuit arrangement, because only a part of the current is diverted to the sub-branch when the limit value is exceeded, while the overall current supplied to the circuit arrangement does not change.

In accordance with an advantageous embodiment of the invention, the base potential of the transistor in the main branch is controlled in dependence upon the collector current of the transistor in the sub-branch in such a way that an increase of the collector current of the transistor in the sub-branch changes the base potential of the transistor in the main branch in such a way that the collector current of the transistor in the main branch is decreased.

Since the transistor in the sub-branch is not turned on abruptly when the limit value is exceeded, a transition range occurs in the proximity of the limit value. The transition range can be narrowed in that the collector current of the transistor in the sub-branch is used for controlling the base potential of the transistor in the main branch. If, for example, PNP transistors are used, the circuit arrangement is implemented in such a way that the collector current of the transistor in the sub-branch increases the base potential of the transistor in the main branch. Consequently, the current in the main branch decreases and the current in the sub-branch further increases.

In accordance with a further advantageous embodiment of the invention, the base potential of the transistor in the main branch is maintained constant, and, upon an increase of the collector current of the transistor in the sub-branch, the base potential of the transistor in the sub-branch is changed in such a way that an increase of the collector current of the transistor in the sub-branch changes its base potential in such a way that its collector current is increased in response to the change of the base potential.

The advantage of the constant base potential of the transistor in the main branch is particularly that the base of this transistor is coupled for alternating current at a low-ohmic value to the reference potential so that a higher bandwidth can be achieved. To realize a narrow transition range, the base potential of the transistor in the sub-branch is controlled by its own collector current. If, for example, PNP transistors are used, the circuit arrangement is implemented in such a way that the collector current of the transistor in the sub-branch decreases its base potential and thus increases the collector current in the sub-branch (self-amplifying effect).

In accordance with a further advantageous embodiment of the circuit arrangement, in which the base potential of the transistor in the main branch is controlled in dependence upon the collector current of the transistor in the sub-branch, the base of the transistor in the main branch is coupled to the collector of the transistor in the sub-branch, and the collector of the transistor in the sub-branch is coupled for alternating current to the reference potential via a resistor.

As soon as a collector current flows in the transistor of the sub-branch, the flow of the current through the inserted resistor realizes the desired potential change at the base of the transistor in the main branch. Due to this potential change, the current in the main branch further decreases, whereas the current in the sub-branch further increases.

In accordance with a further advantageous embodiment of this circuit arrangement, the collector of the transistor in the sub-branch is coupled to the emitter of a third transistor whose collector is coupled to the reference potential, and the base of the transistor is biased with respect to the reference potential. The inserted resistor essentially has for its object to narrow the transition range between the two gain factors. If the ultimate value of the second gain factor is reached, the function of the inserted resistor is actually superfluous. Due to the third transistor, the operation of the inserted resistor can be cancelled as from a given amplitude limit value by coupling the collector potential of the transistor in the main branch for alternating current to the reference potential. The amplitude limit value can be adjusted via the base bias of the third transistor.

In accordance with a further advantageous embodiment of the circuit arrangement, in which the base potential of the transistor in the main branch is controlled in dependence upon the collector current of the transistor in the sub-branch, the base of the transistor in the main branch is coupled to the collector of the transistor in the sub-branch, and the collector of the transistor in the sub-branch is coupled for alternating current to the reference potential via a diode.

The input resistance of the sub-branch results from the sum of the resistances of the emitter resistor of the transistor in the sub-branch and the differential base-emitter resistances of the transistor in the sub-branch subtracted by the resistance of the inserted resistor which is provided for coupling the collector of the transistor in the sub-branch for alternating current to the reference potential. In the range of the limit value, the collector current of the transistor of the sub-branch is still small and, accordingly, the differential base-emitter resistance is very high and dominant with respect to the emitter resistance. If the resistor, which couples the collector of the transistor in the sub-branch for alternating current to the reference potential, is replaced by a diode which has the same differential resistance as the base-emitter path of the transistor in the sub-branch, then these two differential resistances compensate each other and the transition range becomes even narrower.

In accordance with an advantageous embodiment of the circuit arrangement according to the invention, with a constant base potential of the transistor in the main branch, the collector current of the transistor in the sub-branch is coupled to the input of a current mirror circuit whose output signal is coupled to the base of the transistor in the sub-branch, said base of the transistor being biased with respect to the reference potential by means of a DC source.

The feedback of the collector current of the transistor in the sub-branch to its base is realised by means of a current mirror circuit in this case. If, for example, a PNP transistor is used, the base potential is decreased by this feedback and consequently the collector current is increased again. A narrower transition range around the limit value is then realised.

For this embodiment, a DC source is provided, which supplies a direct current to the current mirror circuit.

Real transistors are always beset with unavoidable parasitic capacitances which should be charged or recharged when a current in the current mirror becomes active and thus reduce the rate at which the current mirror becomes active. To avoid this, the current mirror is supplied with a direct current from a DC source which charges the parasitic capacitances and thus increases the rate at which the current mirror becomes active.

These and other aspects of the invention will be apparent from and elucidated with reference to the embodiments described hereinafter.

DESCRIPTION OF THE PREFERRED EMBODIMENTS

Figure 1:
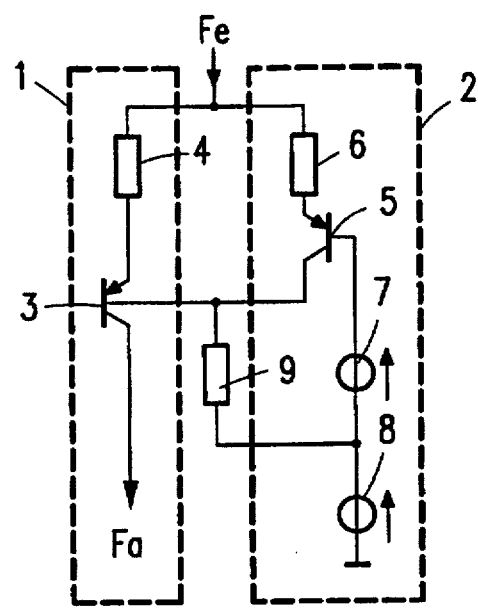
FIG. 1 shows a first embodiment of a circuit arrangement according to the invention, in which the base of the transistor of the main branch is coupled to the collector of the transistor of the sub-branch, and the collector of the transistor of the sub-branch is coupled for alternating current to the reference potential via a resistor.

A circuit arrangement shown in a first embodiment in FIG. 1 essentially consists of two branches, a main branch 1 and a sub-branch 2. The main branch 1 includes a PNP transistor 3 whose emitter receives an input signal $F_e$ via a resistor 4, this input signal being a television signal in the form of a current signal. The output signal $F_a$ of the circuit arrangement is supplied from the collector of the transistor 3, for example, from an NPN current mirror or a Gilbert cell (electronic potentiometer). The sub-branch 2 includes a PNP transistor 5 whose emitter receives the input signal $F_e$ via a resistor 6. The base of the transistor 5 is positively biased with respect to the reference potential by means of two series-arranged DC sources 7 and 8. Moreover, the base of the transistor 3 is coupled to the collector of the transistor 5 and to the junction point of the DC sources 7 and 8 via a resistor 9. The DC sources 7 and 8 have such a voltage value that the base potential of the transistor 5 is larger than that of the transistor 3. At small input current amplitudes, only the transistor 3 is therefore turned on, whereas the transistor 5 is turned off. Consequently, the total input current is passed through the main branch 1 to the output of the circuit and the ratio between the output current amplitude and the input current amplitude is determined by a first gain factor, which in this embodiment substantially assumes the value 1. With an increasing input current of the signal $F_e$, the potential at the input of the circuit arrangement and hence at the emitter of the transistor 5 increases. As, from a limit value, the base-emitter voltage controlling the transistor 5 becomes negative and the transistor 5 gradually becomes conducting. Consequently, a part of the current fed to the circuit arrangement is diverted to the sub-branch 2 and portions of this part of the current having amplitude values which are above the limit value are applied to the output of the circuit arrangement with a second gain factor which is smaller than the first gain factor. In this embodiment, the second gain factor assumes values of between 0 and 1, dependent on the resistances of the resistors 4, 6 and 9.

The transition between gain factor 1 and gain factor 2 is not abrupt, but is in a transition range around the limit value. This is particularly based on the fact that the differential base-emitter resistance of the transistor 5 is initially still very large due to the low collector current. To narrow the transition range, the resistor 9 is provided. As soon as a collector current flows in the sub-branch 2, the base potential of the transistor 3 is raised via the resistor 9 in response to the flow of current, so that while the current in the main branch 1 decreases, it further increases in the sub-branch 2. The value of the second gain factor is reached when the differential base-emitter resistance of the transistor 5 is so small that it can be ignored with respect to the resistors 6 and 9. The input resistance of the sub-branch 2 then results from the value of the resistor 6 subtracted by the value of the resistor 9, and the input current of the signal $F_e$ is divided in accordance with the ratio between the resistances of resistor 4 and the difference between resistor 6 and resistor 9.

In dimensioning the resistor 6 and the resistor 9, it should be noted that the value of the resistor 6 is larger than the value of the resistor 9, because otherwise a negative input resistance of the sub-branch would be formed and the total input current would be diverted to the sub-branch.

Figure 2:
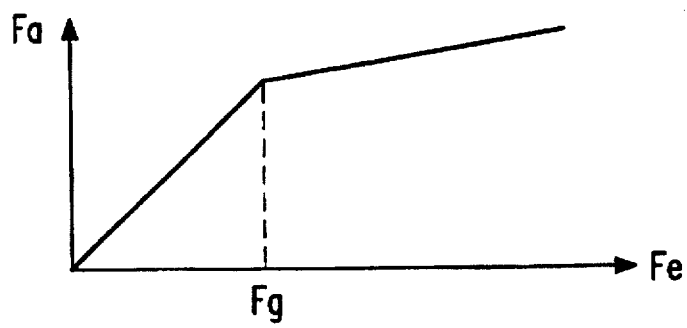
FIG. 2 shows an idealized characteristic curve of the circuit arrangement according to FIG. 1.

FIG. 2 shows an idealized characteristic curve of the circuit arrangement of FIG. 1. The curve shows the output current $F_a$ in the circuit arrangement in dependence upon the input current $F_e$. Below the limit value $F_g$, the input current $F_e$ is amplified by the first gain factor which corresponds to the slope in the left-hand part of the curve. The total input current $F_e$ is passed through the main branch 1 and the transistor 5 of the sub-branch 2 is turned off.

At input currents $F_e$ which are above the limit value $F_g$, the part of the input current below the limit value $F_g$ is amplified by the first gain factor and the part above the limit value is amplified by the second gain factor. The second gain factor corresponds to the slope of the right-hand part of the characteristic curve. Now, both transistor 3 and transistor 5 are turned on and the input current is divided in accordance with the ratio between the resistances of resistor 4 and the difference between resistor 6 and resistor 9.

Figure 3:
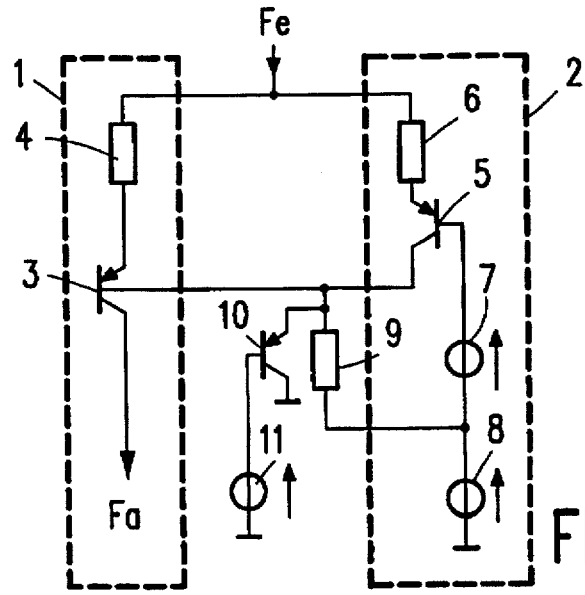
FIG. 3 shows a second embodiment of the circuit arrangement, in which, as distinguished from the first embodiment, the function of the resistor above a predeterminable amplitude limit value is eliminated.

A second embodiment of a circuit arrangement shown in FIG. 3 is essentially identical to the circuit arrangement of the first embodiment shown in FIG. 1. The actual function of the resistor 9 of the circuit arrangement of FIG. 1 is to narrow the transition range between the first and the second gain factor. If the value of the second gain factor is reached, the function of the resistor 9 is actually superfluous. Consequently, a PNP transistor 10 shown in FIG. 3 is provided, whose emitter is coupled to the base of transistor 3. The collector of transistor 10 is coupled to the reference potential, and the base of the transistor 10 is positively biased with respect to the reference potential by means of a DC source 11. When the base potential of the transistor 3 and hence the emitter potential of transistor 10 exceeds the base potential of transistor 10, then transistor 10 will gradually become conducting and couples the collector of transistor 5 to the reference potential. The resistor 9 will then become inactive and the input current is divided in accordance with the ratio between the resistances of resistor 4 and resistor 6.

Figure 4:
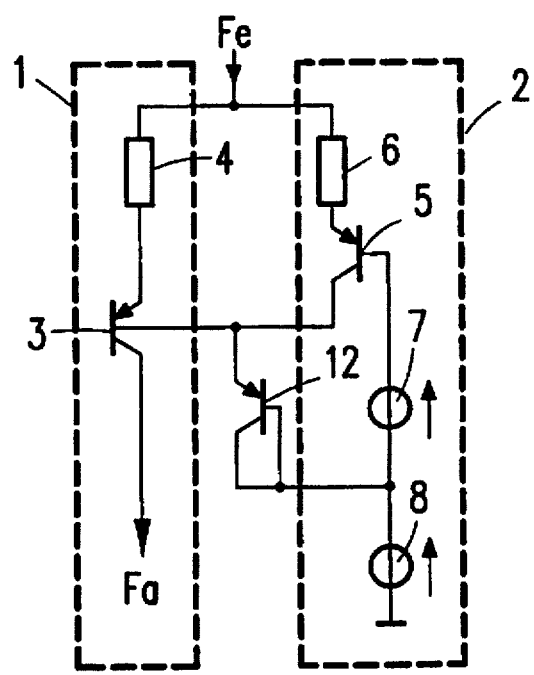
FIG. 4 shows a third embodiment in which, as distinguished from the first embodiment, the resistor is replaced by a diode.

A third embodiment of a circuit arrangement shown in FIG. 4 is essentially identical to the first embodiment of the circuit arrangement shown in FIG. 1. As compared with this circuit arrangement, the resistor 9 is replaced by a diode 12. This diode 12 has the same characteristic as the base-emitter path of the transistor 5. The diode thus compensates the differential base-emitter resistance of the transistor 5, and the input resistance of the sub-branch is essentially equal to the value of the resistor 6.

Figure 5:
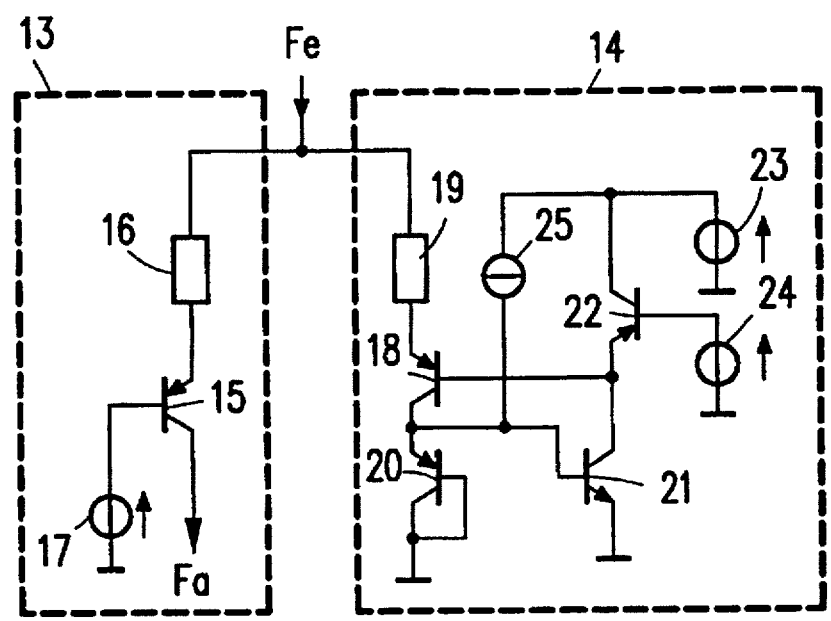
FIG. 5 shows a fourth embodiment of a circuit arrangement according to the invention, in which the main branch and the sub-branch are not coupled together.

A fourth embodiment of the circuit arrangement shown in FIG. 5 comprises two branches, a main branch 13 and a sub-branch 14, which are, however, decoupled from each other. The main branch 13 includes a PNP transistor 15 whose emitter receives the input signal via a resistor 16. The base of the transistor 15 is positively biased with respect to a reference potential by means of a DC source 17. The output signal $F_a$ of the circuit arrangement is supplied from the collector of the transistor 15. The sub-branch 14 includes a PNP transistor 18 whose emitter receives the input signal via a resistor 19. The collector of the transistor 18 is coupled to a current mirror circuit comprising a PNP transistor 20 and an NPN transistor 21. The base and the collector of transistor 20, as well as the emitter of transistor 21 are coupled to the reference potential. Moreover, the collector of transistor 18 is coupled to the emitter of transistor 20, and the base of transistor 21 as well as the collector of transistor 21 are coupled to the base of transistor 18.

Moreover, an NPN transistor 22 is provided, whose emitter is coupled to the collector of transistor 21. The collector and the base of the transistor 22 are positively biased with respect to the reference potential by means of a DC source 23 and a DC source 24, respectively. Moreover, the current mirror at the emitter of the transistor 20 receives a direct current from a DC source 25.

At small current amplitudes, the total input current of the signal $F_e$ is applied to the main branch 13. With an increasing input current, the potential at the emitter of the transistor 18 is increased and this transistor becomes gradually conducting. As soon as a collector current flows in the transistor 18, this current is fed back to the base of the transistor 18 via the current mirror of the transistors 20 and 21. The base potential at the transistor 18 thereby decreases and its collector current increases. Thus, this is a self-amplifying effect. The transistor 22 is intended to couple a DC voltage as a base bias to the base of the transistor 18.

The transistors 20 and 21 of the current mirror are beset with unavoidable parasitic capacitances which should be charged or recharged before a current is applied to the current mirror and thus reduce the starting rate of the current mirror. Consequently, the current mirror is fed with a direct current from a DC source 25, which charges parasitic capacitances and thus increases the starting rate at which the current mirror becomes active.

I claim:

1. A circuit arrangement for amplitude-dependent attenuation of a television signal, said arrangement supplying amplitude values of the television signal below a predeterminable limit value as an output signal amplified by a first gain factor, and, at amplitude values above the predeterminable limit value, supplying a part of the amplitude below the predeterminable limit value as an output signal amplified by the first gain factor and parts of the amplitude above the predeterminable limit value as an output signal amplified by a second gain factor, the second gain factor being chosen to be smaller than the first gain factor, characterized in that the television signal is a current signal which is applied to a main branch and a sub-branch in which said main branch and said sub-branch each comprises at least one transistor, said current signal being applied to an emitter of said at least one transistor via a resistor in each of said main branch and said sub-branch, a base of said at least one transistor in each of said main branch and said sub-branch being biased, with respect to a reference potential, by respective DC sources, a collector current of the at least one transistor in the main branch essentially representing the output signal, and the predeterminable limit value being predetermined by a difference between base potentials of the at least one transistors in the main branch and the sub-branch and the second gain factor being determined by a resistance ratio between the resistors coupled to the emitters of said at least one transistors in said main branch and said sub-branch.

2. A circuit arrangement as claimed in claim 1, characterized in that the base potential of the at least one transistor in the main branch p is controlled in dependence upon a collector current of the at least one transistor in the sub-branch in such a way that an increase of the collector current of the at least one transistor in the sub-branch changes the base potential of the at least one transistor in the main branch in such a way that the collector current of the at least one transistor in the main branch is decreased.

3. A circuit arrangement as claimed in claim 1, characterized in that the base potential of the at least one transistor in the main branch is maintained constant, and in that said circuit arrangement further comprises means for decreasing the base potential of the at least one transistor in the sub-branch upon an increase of the collector current of the at least one transistor in the sub-branch.

4. A circuit arrangement as claimed in claim 2, characterized in that the base of the at least one transistor in the main branch is coupled to the collector of the at least one transistor in the sub-branch, and in that the collector of the at least one transistor in the sub-branch is coupled for alternating current to the reference potential via a resistor.

5. A circuit arrangement as claimed in claim 4, characterized in that the at least one transistor in the sub-branch comprises a first transistor having an emitter for receiving said current signal, a base coupled to said DC source, and a collector coupled to said base of said at least one transistor in the main branch and coupled for alternating current to the reference potential via said resistor, and a second transistor having an emitter coupled to the collector of the first transistor, a collector coupled to the reference potential, and a base biased with respect to the reference potential.

6. A circuit arrangement as claimed in claim 2, characterized in that the base of the at least one transistor in the main branch is coupled to the collector of the at least one transistor in the sub-branch, and in that the collector of the at least one transistor in the sub-branch is coupled for alternating current to the reference potential via a diode.

7. A circuit arrangement as claimed in claim 3, characterized in that the collector current of the at least one transistor in the sub-branch is coupled to an input of a current mirror circuit having an output signal coupled to the base of the at least one transistor in the sub-branch, said base of the at least one transistor in the sub-branch being biased with respect to the reference potential by means of a DC source.

8. A circuit arrangement as claimed in claim 7, characterized in that the current mirror circuit comprises a first transistor and a second transistor, in which a base and a collector of the first transistor are coupled to the reference potential, and an emitter of the first transistor and a base of the second transistor are coupled to the collector of the at least one transistor in the sub-branch, and in which an emitter of the second transistor is coupled to the reference potential, and a collector of the second transistor is coupled to the base of the at least one transistor in the sub-branch.

9. A circuit arrangement as claimed in claim 7, characterized in that a DC source is provided, which supplies a direct current to the current mirror circuit.

10. A circuit arrangement as claimed in claim 8, characterized in that a DC source is provided which supplies a direct current to the current mirror circuit.

* * * * *